(12) United States Patent
Penzes

(10) Patent No.: US 8,024,680 B2
(45) Date of Patent: Sep. 20, 2011

(54) MINIMAL LEAKAGE-POWER STANDARD CELL LIBRARY

(75) Inventor: Paul Penzes, Newport Beach, CA (US)

(73) Assignee: Broadcom Corporation, Irvine, CA (US)

( * ) Notice: Subject to any disclaimer, the term of this patent is extended or adjusted under 35 U.S.C. 154(b) by 548 days.

(21) Appl. No.: 12/110,170

(22) Filed: Apr. 25, 2008

(65) Prior Publication Data

US 2009/0271756 A1  Oct. 29, 2009

(51) Int. Cl.
*G06F 17/50* (2006.01)

(52) U.S. Cl. ........ 716/101; 716/104; 716/106; 716/109; 716/133; 716/136

(58) Field of Classification Search .................. 716/101, 716/104, 106, 109, 132–136
See application file for complete search history.

(56) References Cited

U.S. PATENT DOCUMENTS

| | | | |
|---|---|---|---|
| 7,784,012 B2* | 8/2010 | Correale, Jr. | 716/17 |
| 2006/0107239 A1* | 5/2006 | Zhang et al. | 716/1 |

* cited by examiner

*Primary Examiner* — Paul Dinh
(74) *Attorney, Agent, or Firm* — Sterne, Kessler, Goldstein & Fox PLLC

(57) ABSTRACT

A minimal leakage power Standard Cell Library is provided. The minimal leakage power Standard Cell Library provides minimal leakage power cells with improved speed characteristics. The minimal leakage power Standard Cell Library includes cells from an existing Standard Cell Library and a set of minimal leakage power cells for a selected set of logic functions. The minimal leakage power Standard Cell Library is formed by identifying a set of logic functions. For each logic function in the identified set, a base case for an unfolded implementation of the logic function is determined. Widths for transistors in a transistor topology used in the unfolded implementation of the logic function are determined based on the non-linear leakage power characteristics for the transistor topology to achieve minimal leakage power. The determined widths are then assigned to the transistors and the minimal leakage cell is added to the library.

10 Claims, 5 Drawing Sheets

MINIMAL LEAKAGE-POWER STANDARD CELL LIBRARY

FIELD OF THE INVENTION

The present invention relates generally to integrated circuit design and specifically to Standard Cell Libraries.

BACKGROUND OF THE INVENTION

Wireless devices such as phones and personal digital assistants (PDAs) have become essential business and personal tools. Users are requiring more and more functionality to be supported by these devices. At the same time, users are further demanding that these devices retain or improve their speed without putting any additional drain on their limited battery power. Designers of these devices are therefore faced with two contradictory design constraints. Circuits must operate at fast speeds to meet user expectations yet these same circuits must consume less power to allow for longer battery life.

In the past, technology scaling had provided the necessary speed increases. With the advent of technology scaling, higher and higher levels of integration became possible due to the shrinking device sizes. Technology scaling was providing not only an area scaling but also a delay scaling. According to Moore's "Law", chips were doubling their speed every 18 months. While this "law" has been applicable for more than 20 years, a point has been reached where process scaling no longer delivers the expected speed increases. This is mainly due to the fact certain device parameters have reached atomic scales. One of the consequences of this speed saturation due to technology scaling is that designers must work harder at each stage of the design flow to achieve the last remaining circuit performance. That is, even small speed/leakage-power improvements will come at significantly higher design efforts than in the past.

What is therefore needed are design tools, such as enhanced Standard Cell Libraries, that can produce circuits having optimal speed and leakage power performance.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

Figure 1:
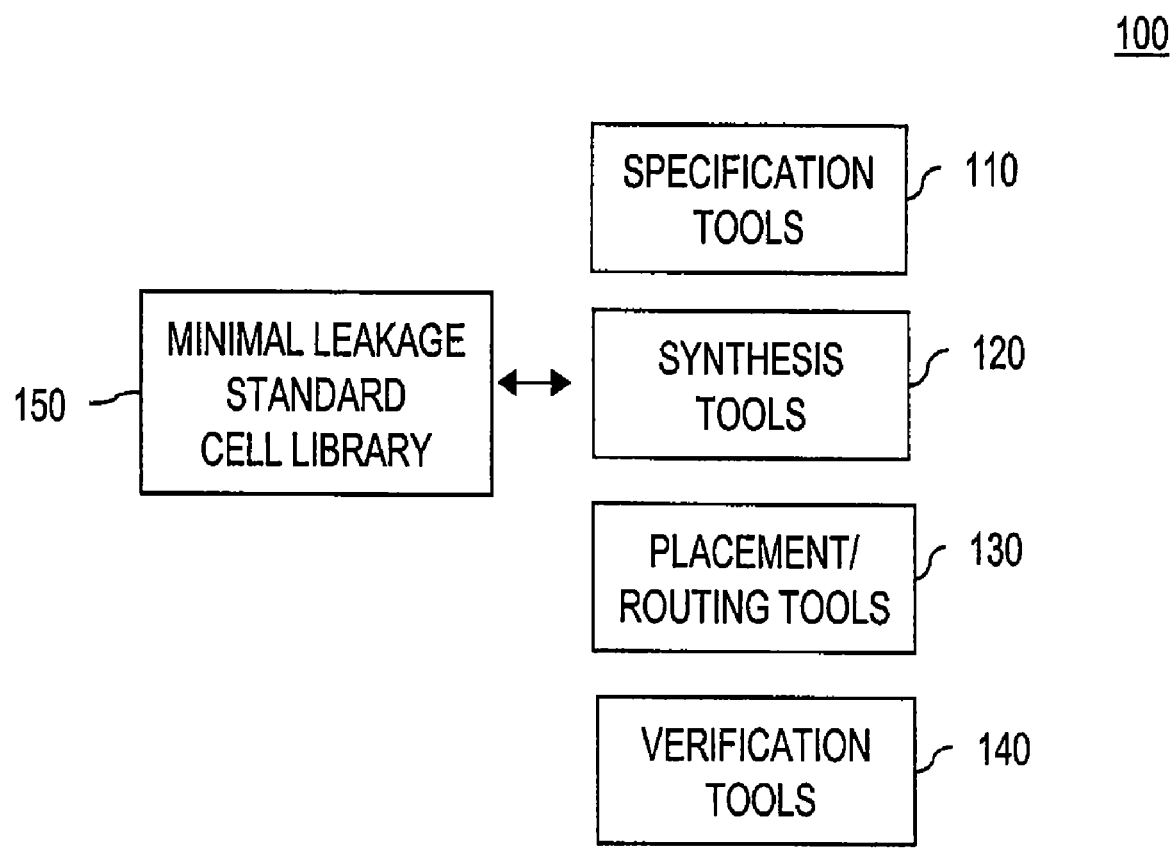
FIG. 1 depicts a high-level environment used in the design of integrated circuits, according to embodiments of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

FIG. 1 depicts a high-level environment 100 used in the design of integrated circuits, according to embodiments of the present invention. Design environment 100 includes specification tools 110, synthesis tools 120, placement/routing tools 130, and verification tools 140. During the design process, the functionality of the chip is specified in a specification tool 110 using a standard hardware programming language such as verilog. The resulting circuit description is synthesized/mapped into the basic gates of a standard cell library, such as minimal leakage-power Standard Cell Library 150, using one or more synthesis tools 120 such as Synopsys' DesignCompiler, produced by Synopsys, Inc. of Mountain View, Calif. The resulting gate netlist is then placed and routed using placement/routing tools 130 such as Magma's BlastFushion, produced by Magma, Inc. of San Jose, Calif. Finally, the connectivity (LVS) and functionality of the integrated circuit are verified using a verification tool 140.

While each of these components is important for the final quality of the resulting integrated circuit, the quality of implementation achievable by most of these components is design dependent. For example, a good verilog code specifying circuit A, does not make an independent circuit B any better. However, an adequate Standard Cell Library makes all designs better. The quality of the Standard Cell Library influences all designs and as such has a far reaching influence on the quality of the resulting integrated circuit chip.

A Standard Cell Library includes hundreds of cells that can be selectively combined to design a larger circuit. Each cell in the library is associated with a specific logic function. Each logic function may be implemented in one or more predefined cells. For example, a logic function may have multiple layouts, each having different characteristics.

A cell in Standard Cell Library is laid out relative to a grid defined by horizontal and vertical tracks. The number of horizontal tracks defines the height of the cell and the number of vertical tracks defines the width of the cell. Cells in a Standard Cell Library have the same height (or integer multiple of that height). A Standard Cell Library is generally classified by its track height. For example, a 10-track library is composed of cells having heights of 10 tracks (or an integer multiple thereof). The widths of cells in a library may vary. Because the heights of cells are consistent, cells of Standard Cell Library may be readily combined to create larger circuits.

Minimal leakage-power X-Track Standard Cell Library 150 is composed of an existing X-Track Standard Cell Library with added minimal leakage-power cells for a set of logic functions. A logic function for a cell is implemented with one or more transistors arranged in a specific topology. A minimal leakage-power cell is a cell that achieves the minimum leakage for the transistor topology implementing the function.

In the past, transistors achieved minimum leakage at their minimum feasible width. With the advent of submicron technologies such as the latest 40 nm technology, this is no longer the case. With submicron technologies several new effects become significant. One such effect is the well proximity effect (WPE). Once these new effects are taken into consideration, the minimum leakage transistors no longer correspond to the minimally sized transistors.

Figure 2:
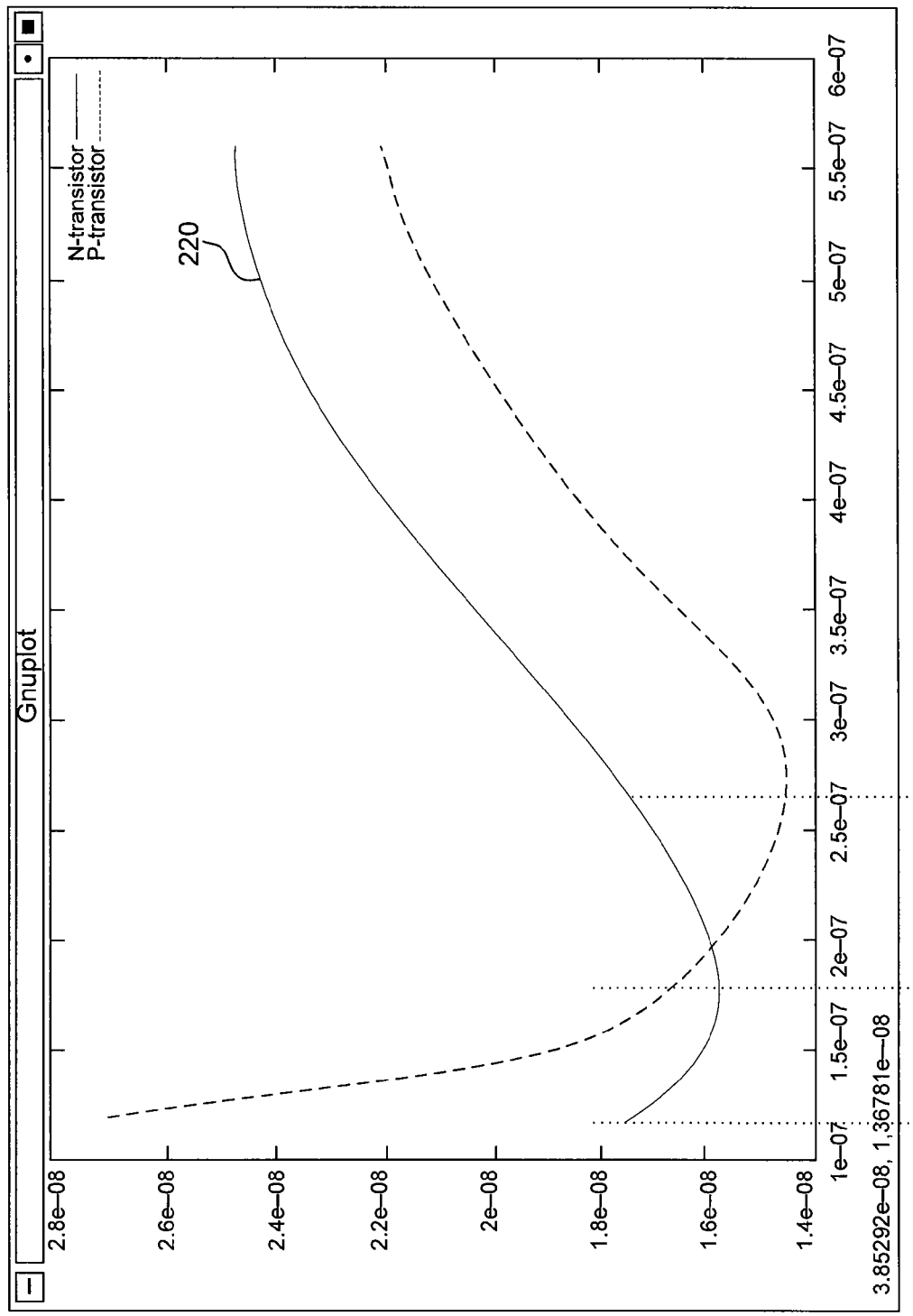
FIG. 2 depicts a graph of the leakage power characteristics of an N-transistor and a P-transistor as a function of transistor width.

FIG. 2 depicts a graph 200 of the leakage power characteristics of an N-transistor (curve 210) and a P-transistor (curve 220) as a function of transistor width. This graph represents alterations to leakage power characteristics of transistors due to various effects, including WPE. Normally, without WPE, the leakage power curve for a transistor are strictly increasing. Therefore, the minimal leakage power occurs at the left most point of the graph. In the graph of FIG. 2, the minimal leakage power occurs at the graph minimum which is no longer the minimum width of the transistor. Therefore, greater speed can be achieved for the cell.

In the example graph of FIG. 2, while the width of the smallest feasible N-transistor is 0.12 micro meters (point A), the minimal leakage N-transistor has a width of 0.265 micro meters (point B). As depicted in FIG. 2, the leakage power difference between the minimum width N-transistor and the minimum leakage N-transistor is more than double. The same effect exists for the P-transistor but it is somewhat less pronounced. For the P-transistor, minimum leakage is achieved for a width of 0.175 micro meters (point C).

When more than one transistor is included in a topology (e.g., two, three, or more in series or parallel), the transistor width for minimum leakage is different than the single transistor case depicted in FIG. 2. For this reason, the minimum leakage widths for the most prevalent transistor topologies encountered in logic functions are predetermined.

In addition to determining the proper transistor width to achieve minimal leakage, due to the WPE mentioned earlier, it is important that the transistors are placed as close as possible to the edge of the well. This is because the WPE is maximal there. The WPE results in a higher transistor threshold which then further reduces leakage.

Figure 3:
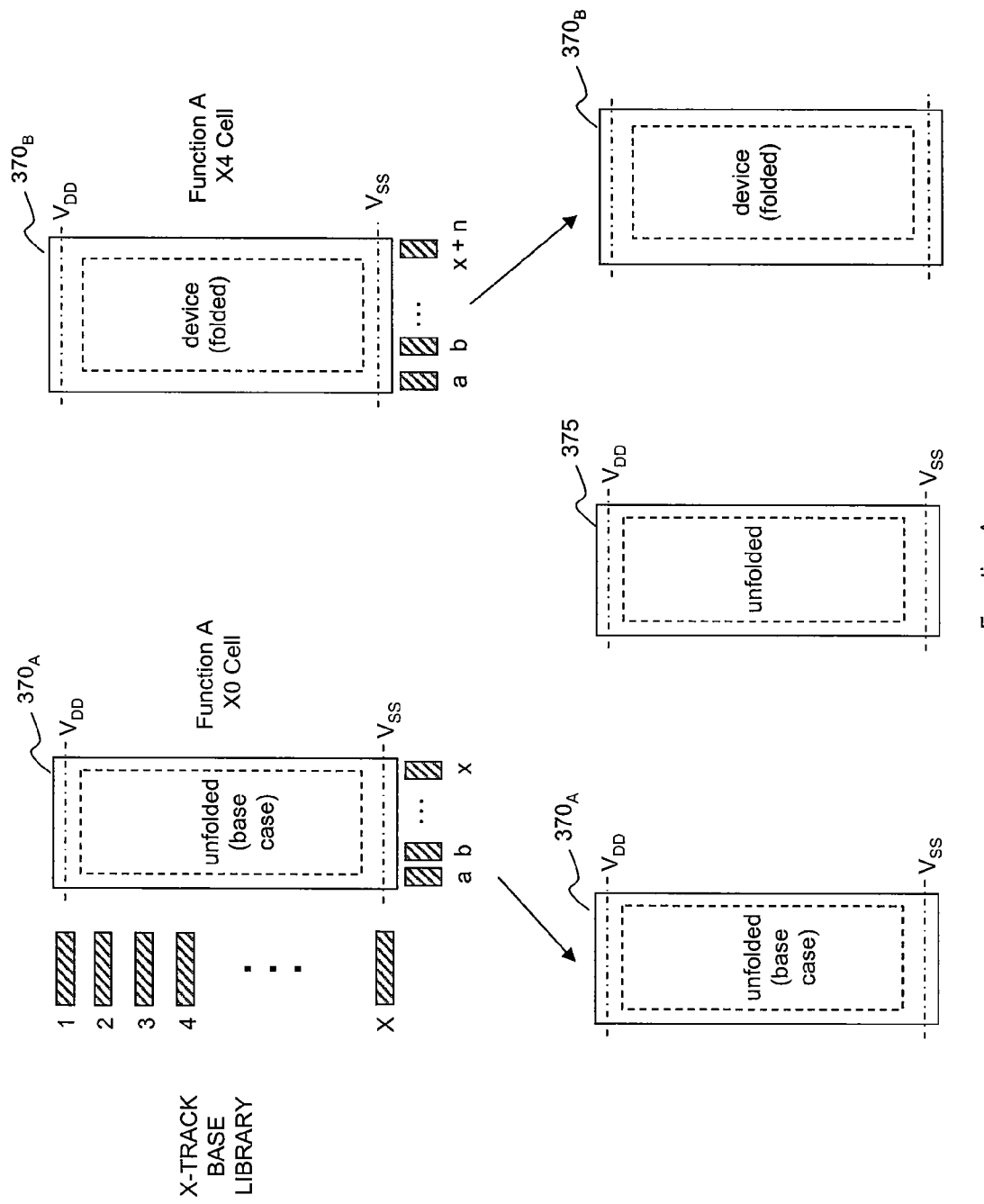
FIG. 3 depicts the exemplary contents of a minimal leakage X-Track Standard Cell Library for a specific logic function, A, according to embodiments of the present invention.

FIG. 3 depicts the exemplary contents of a minimal leakage X-Track Standard Cell Library for a specific logic function, A, according to embodiments of the present invention. The top row of FIG. 3 depicts the contents of an existing X-Track Standard Cell Library for logic function A. For a given logic function of a cell library (such as function A), a set of cells having different drive strength characteristics are included in the library. Often there is a base case from which the higher drive strength cells are produced by transistor folding (i.e., composing the same transistor topology in parallel). Existing X-Track library includes two cell layouts for function A. Cell $370_A$ is the base case cell for the function. Cell $370_B$ (also referred to as the X4 cell) is a folded version of the base case cell (i.e., a cell having the transistor topology of base case cell $370_A$ in parallel). By convention, cells are labeled with an X followed by n which denotes the relative drive strength of the cell. The drive strength of an unfolded gate (such as base case cell $370_A$) that occupies the entire cell template is X2. If the gate is folded once, for example, then its drive strength is denoted X4.

The extra drive strength cells (i.e., the folded cells) are used most often in delay sensitive circuit paths. In contrast, the minimal leakage cells are most useful where the system has some timing slack, such that no higher drive-strength cells are necessary. Therefore, in an embodiment, minimal leakage implementations are added to the X-Track library for only the unfolded base case for the logic function.

The bottom row of FIG. 3 depicts the content of a minimal leakage X-Track Standard Cell Library for function A. Minimal leakage X-Track Standard Cell Library includes cells $370_A$ and $370_B$ from the existing X-Track library as well as the minimal leakage implementation of base call cell $370_A$ (cell 375). As would be appreciated by persons of skill in the art, in an embodiment, a minimal leakage implementation of one or more folded cells for a function may also be added to the library.

The type and number of minimal leakage cells added to the existing X-Track Standard Cell Library is dependent upon the efficiency required for the synthesis tool or application. Adding too many cells to a Standard Cell Library may significantly reduce the efficiency of the synthesis tool and the quality of the resulting integrated circuit. This is because the synthesis tool may have difficulty handling a large number of choices. Accordingly, minimal leakage X-Track cells may only be provided for the most used logic functions. Commonly used functions include, but are not limited to, AND gates, NAND gates, inverters, OR gates, NOR gates, and flip flops. As would be appreciated by persons of skill in the art, as design tools become more sophisticated, minimal leakage Standard Cell Library 150 can be further extended to include minimal leakage cells for a majority or all supported logic functions.

Each cell in the minimal leakage Standard Cell Library 150 is associated with a set of data characterizing the cell. Example data includes the drive strength (speed) and leakage power characteristics associated with the cell. A syntheses tool uses the data or a subset of the data to determine which cell to select for the required logic function. For example, for tasks which have extra timing margin, the design tool may select a cell having less drive strength (slower speed) but better leakage power characteristics (e.g., the minimal leakage cell 375). For tasks which have limited timing margin, the design tool may select a cell having greater drive strength (faster speed) and worse leakage power characteristics (e.g., folded cell $370_B$ (X4)).

Figure 4:
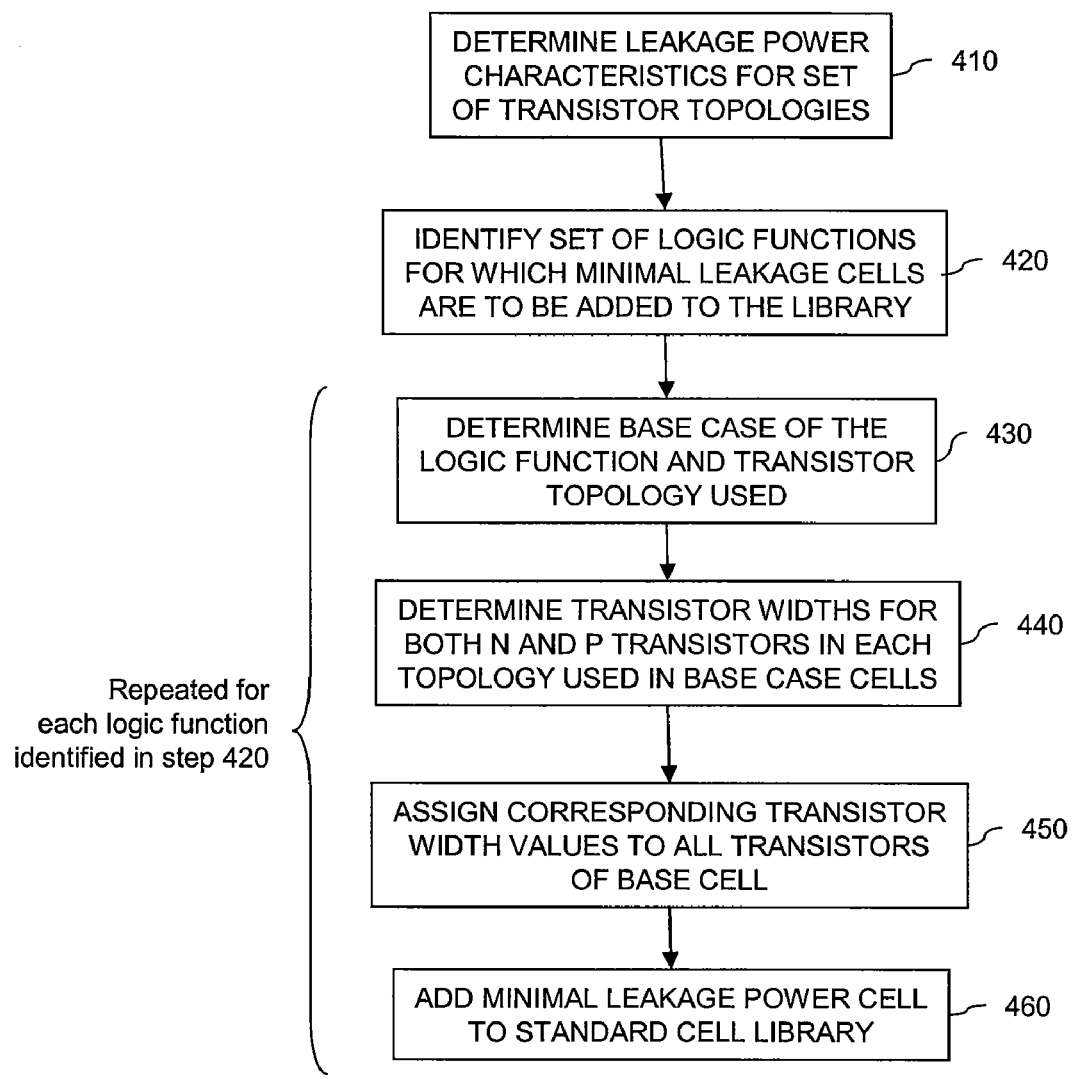
FIG. 4 depicts an exemplary flowchart of generating a minimal leakage Standard Cell Library, according to embodiments of the present invention.

FIG. 4 depicts an exemplary flowchart 400 of generating a minimal leakage Standard Cell Library 150, according to embodiments of the present invention. Flowchart 400 is described with continued reference to the embodiment of FIG. 1. However, flowchart 400 is not limited to that embodiment.

In step 410, the leakage power characteristics for a set of transistor topologies is determined. FIG. 2 represents the exemplary leakage power characteristics for a single transistor topology. In an embodiment, the most common transistor topologies used to implement logic functions within a cell library are identified. Leakage power characteristics for N and P transistors used in these topologies are then determined in this step. In alternate embodiments, the set of transistor topologies includes all transistor topologies used in the Standard Cell Library.

In step 420, the set of logic functions for which minimal leakage cells are to be added to the Standard Cell library is identified. The number of functions for which minimal leakage cells are added is dependent upon the efficiency required for the synthesis tool or application. Adding too many cells to a Standard Cell Library may significantly reduce the efficiency of the synthesis tool and the quality of the resulting integrated circuit. This is because the synthesis tool may have difficulty handling a large number of choices. Accordingly, minimal leakage X-Track cells may only be provided for the most used logic functions. Commonly used functions include, but are not limited to, AND gates, NAND gates, inverters, OR gates, NOR gates, and flip flops. As would be appreciated by persons of skill in the art, as design tools become more sophisticated, minimal leakage Standard Cell Library 150 can be further extended to include minimal leakage cells for a majority or all supported logic functions.

Steps 430 through 460 are repeated for each logic function identified in step 420.

In step 430, the base case (unfolded version) of the logic function in the set of identified logic function and the transistor topology used in the base case are determined.

In step 440, the transistor widths for the N and P transistors used in the base case are determined using the leakage power characteristics for the topology of the logic function (as determined in step 410 and 430). For example, using the leakage power graph for the topology such as graph 200 of FIG. 2, the width at which the graph minimum occurs is identified. In the context of FIG. 2, an inverter cell with minimum leakage would have the N-transistor width (0.265 micro meters) and the P-transistor width (0.175 micro meters).

In step 450, the corresponding transistor widths are assigned to the transistors in the base case. Upon completion of step 450, the minimal leakage cell is ready for layout and characterization.

In step 460, the minimal leakage cell is added to the X-Track Standard Cell Library for the logic function.

After flowchart 400 is completed, the minimal leakage cells are available to the synthesis tool and circuits can be synthesized using them. When the minimal leakage cells are added to a 40 nm Standard Cell Library, the leakage power of the circuit may be successfully reduced by 20-30% without any speed and/or area penalty. As a side-effect, the dynamic power may also be reduced by 10-15%.

Example Computer System

The embodiments of the present invention, or portions thereof, can be implemented in hardware, firmware, software, and/or combinations thereof.

Figure 5:
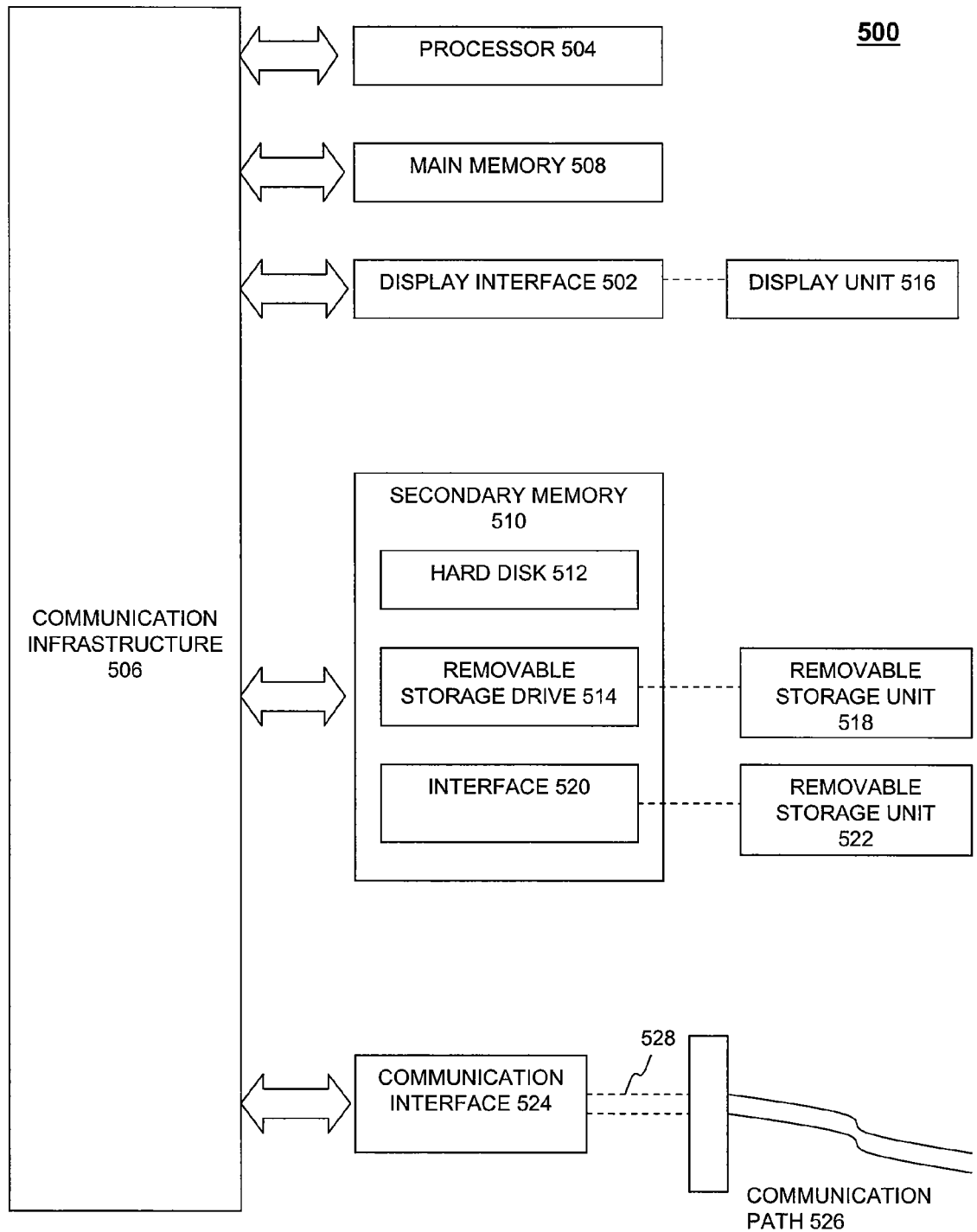
FIG. 5 depicts a block diagram of an exemplary general purpose computer system.

The following description of a general purpose computer system is provided for completeness. Embodiments of the present invention can be implemented in hardware, or as a combination of software and hardware. Consequently, embodiments of the present invention, such as the method of FIG. 4 above, may be implemented in the environment of a computer system or other processing system. An example of such a computer system 500 is shown in FIG. 5. The computer system 500 includes one or more processors, such as processor 504. Processor 504 can be a special purpose or a general purpose digital signal processor. The processor 504 is connected to a communication infrastructure 506 (for example, a bus or network). Various software implementations are described in terms of this exemplary computer system. After reading this description, it will become apparent to a person skilled in the relevant art how to implement the invention using other computer systems and/or computer architectures.

Computer system 500 also includes a main memory 508, preferably random access memory (RAM), and may also include a secondary memory 510. The secondary memory 510 may include, for example, a hard disk drive 512, and/or a removable storage drive 514, representing a floppy disk drive, a magnetic tape drive, an optical disk drive, etc. The removable storage drive 514 reads from and/or writes to a removable storage unit 518 in a well known manner. Removable storage unit 518, represents a floppy disk, magnetic tape, optical disk, etc. As will be appreciated, the removable storage unit 518 includes a computer usable storage medium having stored therein computer software and/or data.

In alternative implementations, secondary memory 510 may include other similar means for allowing computer programs or other instructions to be loaded into computer system 500. Such means may include, for example, a removable storage unit 522 and an interface 520. Examples of such means may include a program cartridge and cartridge interface (such as that found in video game devices), a removable memory chip (such as an EPROM, or PROM) and associated socket, and other removable storage units 522 and interfaces 520 which allow software and data to be transferred from the removable storage unit 522 to computer system 500.

Computer system 500 may also include a communications interface 524. Communications interface 524 allows software and data to be transferred between computer system 500 and external devices. Examples of communications interface 524 may include a modem, a network interface (such as an Ethernet card), a communications port, a PCMCIA slot and card, etc. Software and data transferred via communications interface 524 are in the form of signals 528 which may be electronic, electromagnetic, optical or other signals capable of being received by communications interface 524. These signals 528 are provided to communications interface 524 via a communications path 526. Communications path 526 carries signals 528 and may be implemented using wire or cable, fiber optics, a phone line, a cellular phone link, an RF link and other communications channels.

The terms "computer program medium" and "computer usable medium" are used herein to generally refer to media such as removable storage drive 514, a hard disk installed in hard disk drive 512, and signals 528. These computer program products are means for providing software to computer system 500.

Computer programs (also called computer control logic) are stored in main memory 508 and/or secondary memory 510. Computer programs may also be received via communications interface 524. Such computer programs, when executed, enable the computer system 500 to implement the present invention as discussed herein. In particular, the computer programs, when executed, enable the processor 504 to implement the processes of the present invention. Where the invention is implemented using software, the software may be stored in a computer program product and loaded into computer system 500 using raid array 516, removable storage drive 514, hard drive 512 or communications interface 524.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for forming a minimal leakage standard cell library, comprising:

adding a plurality of cells associated with a first set of logic functions to the minimal leakage standard cell library using a processor, wherein each logic function in the first set of logic functions includes an unfolded base case cell and a folded cell;

identifying a second set of logic functions, wherein the second set of logic functions is a subset of the first set of logic functions;

adding a minimal leakage power cell for each of the identified set of logic functions to the minimal leakage standard cell library, wherein adding the leakage power cell includes:

determining a base case for an unfolded implementation of the logic function, determining widths for transistors in a transistor topology used in the unfolded implementation of the logic function based on non-linear leakage power characteristics for the transistor topology to achieve minimal leakage power for the transistor topology, assigning the determined widths to the transistors to generate a minimal leakage cell for the logic function.

2. The method of claim 1, further comprising, prior to identifying the set of logic functions:

determining leakage power characteristics for a set of transistor topologies.

3. The method of claim 2, wherein determining widths for transistors in the transistor topology includes:

determining widths for transistors in the transistor topology used in the unfolded implementation based on the leakage power characteristics for the transistor topology.

4. The method of claim 1, further comprising:

adding a second minimal leakage power cell for each of the identified set of logic functions to the minimal leakage standard cell library, wherein adding the leakage power cell includes:

determining a base case for a folded implementation of the logic function, determining widths for transistors in a transistor topology used in the folded implementation of the logic function based on non-linear leakage power characteristics for the transistor topology to achieve minimal leakage power for the transistor topology, assigning the determined widths to the transistors to generate the second minimal leakage power cell for the logic function.

5. The method of claim 1, wherein identifying a set of logic functions includes:

identifying the most commonly occurring logic functions.

6. A computer program product comprising a non-transitory computer useable storage medium including instructions stored therein, the instructions when executed by a computational device enabling the formation of a minimal leakage standard cell library comprising:

means for enabling a processor to add a plurality of cells associated with a first set of logic functions to the minimal leakage standard cell library, wherein each logic function in the first set of logic functions includes an unfolded base case cell and a folded cell;

means for enabling the processor to identify a second set of logic functions, wherein the second set of logic functions is a subset of the first set of logic functions;

means for enabling the processor to add a minimal leakage power cell for each of the identified set of logic functions to the minimal leakage standard cell library, wherein means for enabling the processor to add includes:

means for enabling the processor to determine a base case for an unfolded implementation of the logic function, means for enabling the processor to determine widths for transistors in a transistor topology used in the unfolded implementation of the logic function based on non-linear leakage power characteristics for the transistor topology to achieve minimal leakage power for the transistor topology, means for enabling the processor to assign the determined widths to the transistors to generate a minimal leakage cell for the logic function.

7. The computer program product of claim 6, the control logic further comprising:

means for enabling the processor to determine leakage power characteristics for a set of transistor topologies.

8. The computer program product of claim 7, wherein means for enabling the processor to determine widths for transistors in the transistor topology includes:

means for enabling the processor to determine widths for transistors in the transistor topology used in the unfolded implementation based on the leakage power characteristics for the transistor topology.

9. The computer program product of claim 6, the control logic further comprising:

means for enabling the processor to add a second minimal leakage power cell for each of the identified set of logic functions to the minimal leakage standard cell library, wherein means for enabling the processor to add a second minimal leakage power cell includes:

means for enabling the processor to determine a base case for a folded implementation of the logic function, means for enabling the processor to determine widths for transistors in a transistor topology used in the folded implementation of the logic function based on non-linear leakage power characteristics for the transistor topology to achieve minimal leakage power for the transistor topology, means for enabling the processor to assign the determined widths to the transistors to generate the second minimal leakage power cell for the logic function.

10. The computer program product of claim 6, the control logic further comprising:

means for enabling the processor to identify the most commonly occurring logic functions.

\* \* \* \* \*